(12) United States Patent
Wissert

(10) Patent No.: US 10,638,589 B2
(45) Date of Patent: Apr. 28, 2020

(54) AMPLIFYING LASER PULSES HAVING DIFFERENT WAVELENGTHS FOR EUV RADIATION GENERATION

(71) Applicant: TRUMPF Lasersystems for Semiconductor Manufacturing GmbH, Ditzingen (DE)

(72) Inventor: Matthias Wissert, Stuttgart (DE)

(73) Assignee: TRUMPF Lasersystems for Semiconductor Manufacturing GmbH, Ditzingen (DE)

( * ) Notice: Subject to any disclaimer, the term of this patent is extended or adjusted under 35 U.S.C. 154(b) by 0 days.

(21) Appl. No.: 15/990,467

(22) Filed: May 25, 2018

(65) Prior Publication Data

US 2018/0279459 A1  Sep. 27, 2018

Related U.S. Application Data

(63) Continuation of application No. PCT/EP2015/077873, filed on Nov. 27, 2015.

(51) Int. Cl.
*H05G 2/00* (2006.01)
*H01S 3/00* (2006.01)
(Continued)

(52) U.S. Cl.
CPC ......... *H05G 2/008* (2013.01); *G03F 7/70033* (2013.01); *H01S 3/005* (2013.01);
(Continued)

(58) Field of Classification Search
CPC ........ H05G 2/008; H03S 3/005; H03S 3/2391
See application file for complete search history.

(56) References Cited

U.S. PATENT DOCUMENTS

| 5,452,313 A | 9/1995 | Fink |
| 2006/0082867 A1* | 4/2006 | Starodoumov ..... H01S 3/06758 359/337 |

(Continued)

FOREIGN PATENT DOCUMENTS

| DE | 4127407 | 2/1993 |
| DE | 0674374 | 9/1995 |

(Continued)

OTHER PUBLICATIONS

International Search Report from corresponding PCT Application No. PCT/EP2014/064958, dated Mar. 18, 2015, 4 pages.

(Continued)

*Primary Examiner* — Eliza W Osenbaugh-Stewart
(74) *Attorney, Agent, or Firm* — Fish & Richardson P.C.

(57) ABSTRACT

Methods, devices, and systems for amplifying laser pulses having different wavelengths in a drive laser assembly for an extreme ultraviolet (EUV) radiation generating device are provided. The drive laser assembly includes a radiation source configured to generate a first laser pulse having a first wavelength and a second laser pulse having a second wavelength, and an amplifier assembly having at least one optical amplifier for amplifying the first laser pulse and the second laser pulse. The amplifier assembly has at least one wavelength-selective optical element configured to attenuate the first laser pulse at the first wavelength more strongly than the second laser pulse at the second wavelength.

21 Claims, 1 Drawing Sheet

(51) Int. Cl.
*G03F 7/20* (2006.01)
*H01S 3/23* (2006.01)
(52) U.S. Cl.
CPC .......... *H01S 3/0064* (2013.01); *H01S 3/2308* (2013.01); *H01S 3/2391* (2013.01)

(56) References Cited

U.S. PATENT DOCUMENTS

| | | | |
|---|---|---|---|
| 2006/0192152 A1* | 8/2006 | Ershov | H05G 2/003 250/503.1 |
| 2008/0149862 A1 | 6/2008 | Hansson et al. | |
| 2009/0095925 A1 | 4/2009 | Ershov et al. | |
| 2011/0192995 A1 | 8/2011 | Ershov | |
| 2014/0319388 A1* | 10/2014 | Moriya | H05G 2/008 250/504 R |
| 2016/0028210 A1* | 1/2016 | O'Shaughnessy | G01N 21/645 372/34 |

FOREIGN PATENT DOCUMENTS

| | | |
|---|---|---|
| EP | 0674374 | 9/1995 |
| EP | 0674375 | 9/1995 |
| WO | WO 2011/162903 | 12/2011 |
| WO | WO 2012/073087 | 6/2012 |
| WO | WO 2013/104947 | 7/2013 |
| WO | WO 2011/162093 | 8/2013 |
| WO | WO 2016/005006 | 1/2016 |

OTHER PUBLICATIONS

Notification of Transmittal of translation of the International Preliminary Report on Patentability and the Written Opinion of the International Search Authority for corresponding PCT Application No. PCT/EP2014/064958, dated Jan. 26, 2017, 15 pages.

International Preliminary Report on Patentability in International application No. PCT/EP2015/077873, dated Jun. 7, 2018, 13 pages (with English translation).

International Search Report and Written Opinion in International Application No. PCT/EP2015/077873, dated Jul. 28, 2016, 14 pages (with English translation).

* cited by examiner

AMPLIFYING LASER PULSES HAVING DIFFERENT WAVELENGTHS FOR EUV RADIATION GENERATION

CROSS REFERENCE TO RELATED APPLICATIONS

This application is a continuation of and claims priority under 35 U.S.C. § 120 from PCT Application No. PCT/EP2015/077873 filed on Nov. 27, 2015, the entire content of which is incorporated herein by reference.

TECHNICAL FIELD

The present invention relates to methods, devices, and systems for amplifying laser pulses having different wavelengths in a drive laser assembly for an extreme ultraviolet (EUV) radiation generating device.

BACKGROUND

A drive laser assembly for an EUV light source is known, for example, from US 2006/0192152 A1 and US 2009/0095925 A1. The radiation source of the drive laser assembly is used to generate so-called seed pulses, which are amplified in the optical amplifier or amplifiers to high laser powers of multiple kilowatts, possibly 10 kW or greater. The laser radiation amplified by the drive laser assembly is supplied via a beam guiding unit to a focusing unit, which focuses the laser radiation in a target region. A target material is provided in the target region, which passes into a plasma state upon the irradiation using the laser radiation and emits EUV radiation at the same time.

In the above-described drive laser assembly, a first laser pulse (pre-pulse) and chronologically successively a second laser pulse (main pulse) are typically generated by the radiation source and focused on the target region having the target material. The first laser pulse is to be used for the purpose of influencing the target material, for example, heating it up, expanding it, vaporizing it, ionizing it, and/or generating a weak or possibly a strong plasma. The second laser pulse is to be used for the purpose of converting the main part of the material influenced by the first laser pulse into the plasma state and generating EUV radiation at the same time. The first laser pulse typically has a significantly lower laser power than the second laser pulse. In the drive laser assembly of US 2009/0095925 A1, the same laser wavelength is used for the first laser pulse and for the second laser pulse.

It is also possible to use different wavelengths for the first laser pulse and for the second laser pulse, as described in WO 2011/162903 A1, in which a seed laser is used to generate the first laser pulse and a further seed laser having a different wavelength is used to generate the second laser pulse. The two laser pulses having different wavelengths are combined by means of a beam combiner to pass through one or more amplifiers and the beam guiding unit following the drive laser assembly along a common beam path.

In the above-described drive laser assembly, a reflection of the amplified laser radiation can take place, for example, at the target material, which can be provided in the form of tin droplets, for example. The reflection generated at such a droplet passes back in the optical amplifier or amplifiers and passes through the amplification medium provided therein, and therefore the reflection is also amplified in the optical amplifier or amplifiers. A weak reflection is also possibly sufficient to generate a power after the amplification in the amplification medium of the optical amplifier or amplifiers, which can damage the optical or possibly mechanical components in the amplifier assembly or in the beam path before the optical amplifier.

Using so-called optical isolators, which transmit laser radiation in only one direction and are also referred to as optical diodes because of this property, is known for suppressing reflected laser radiation. Such optical isolators can be arranged, for example, between a radiation source and an optical amplifier or also between two optical amplifiers. For example, installing an optical diode in each case between an injection seeding laser and a resonator and between a resonator and an amplifier is known from DE 41 27 407 A1.

In the above-described drive laser assembly, high laser powers of 500W or greater, of 1 kW or greater, and even of 10 kW and more can be generated during the amplification. At such high laser powers, the problem exists that the optical components used in conventional optical isolators possibly induce strong thermally-related aberrations, in particular astigmatism, and moreover can possibly be damaged by the laser radiation. Moreover, the problem exists that optical isolators generally cannot 100% suppress laser radiation that propagates in the undesired direction, and therefore at high laser powers, in spite of the use of optical isolators, the non-suppressed power component is sufficiently large that returning laser radiation is possibly generated in spite of the use of an optical isolator. This is additionally made more difficult in the present application because optical diodes, which are based on the principle of the polarizer or phase shifter because of their construction, can only suppress laser radiation having a specific phase jump or having a specific phase shift (for example, 180°). The value for this phase jump or for this phase shift will possibly not be maintained upon the reflection on a droplet, and therefore the laser radiation reflected on the droplet can also not be completely suppressed by the optical diode for this reason.

Eliminating harmful feedback reflections from a power amplifier in a laser master oscillator is known from EP 0 674 375 A2, by arranging a non-reciprocal (acousto-optical) frequency shift unit between the oscillator and the amplifier, which shifts the laser frequency by more than twice the bandwidth of the optical resonator of the laser oscillator.

SUMMARY

The disclosure provides drive laser assemblies for EUV radiation generating devices, EUV radiation generating devices, and methods for amplifying first and second laser pulses, in which a possibly reflected first laser pulse can be effectively suppressed.

In one aspect, the present disclosure features drive laser assemblies (or drive laser systems), in which amplifier assemblies (or amplifier systems) have at least one wavelength-selective optical element (or wavelength selector), which is designed to attenuate the first laser pulse at the first wavelength more strongly than the second laser pulse at the second wavelength. The drive laser assemblies or systems are used for driving EUV radiation generating devices. The at least one wavelength-selective optical element can be in the amplifier assemblies or separate from the amplifier assemblies. The at least one wavelength-selective optical element can be in the driver laser assemblies or separate from the driver laser assemblies.

As described above, the first laser pulse (pre-pulse) and the second laser pulse (main pulse) are radiated in short chronological succession in sequence onto the target material. The two laser pulses pass through the amplifier assembly having the at least one optical amplifier in the same beam path, but with a slight time delay. The first laser pulse is to have a lower power than the second laser pulse.

In the case of the use described herein of an amplifier assembly in a drive laser assembly, it is advantageous if the (total) amplification of the amplifier assembly for the first laser pulse is reduced in relation to the (total) amplification for the second laser pulse. Instead of a reduction of the power of the radiation source generating the first laser pulse, the amplification of the first laser pulse in the amplifier assembly is reduced in relation to the amplification of the second laser pulse, by the wavelength-selective optical element more strongly attenuating the first laser pulse having the first wavelength than the second laser pulse having the second wavelength.

This is advantageous, because a part of the power of the first laser pulse is reflected back into the beam path at the target material, which passes through the optical amplifier or amplifiers of the amplifier assembly, is possibly amplified thereby to a destructive power, and is fed back into the radiation source. The reflection or the reflected component of the laser radiation of the first laser pulse is amplified in the optical amplifiers using the presently available amplification. The amplification of the returning laser radiation is problematic in particular in the case of the first laser pulse, because, given the low power of the first laser pulse, a very large amount of "power" or a high population inversion is still present in the amplifier medium of the optical amplifiers or the single optical amplifier, which the reflection of the first laser pulse uses as it passes back through the optical amplifier or amplifiers and experiences a significant amplification in this case.

A wavelength-selective reflection protection is implemented by the wavelength-selective optical element, because the reflected component of the first laser pulse is more strongly attenuated by the wavelength-selective optical element than the second laser pulse or the reflected component thereof. The lower amplification of the amplifier assembly for the first laser pulse in the forward direction can be compensated for, up to a certain degree, in that the radiation source that generates the first laser pulse generates a higher laser power, e.g., a higher laser power is selected for the seed pulse of the radiation source than would be necessary without the introduction of the wavelength-selective optical element into the beam path of the amplifier assembly.

The arrangement of two or more wavelength-selective optical elements at different positions in the amplifier assembly can be used for performing an optimization of the amplification for the respective wavelengths, in particular for the first wavelength. This is advantageous in particular if the optical amplifiers or individual ones of the optical amplifiers are operated in saturation, e.g., have a nonlinear amplification. In this case, the amplifier assembly can be optimized as a whole with respect to its amplification by a suitable definition of the respective attenuation, which is generated by the wavelength-selective optical elements at different positions within the amplifier assembly.

To generate a different amplification of the first laser pulse and the second laser pulse in the amplifier assembly, it can possibly be advantageous, in addition to the use of one or more wavelength-selective optical elements, to tune or change the wavelength/laser frequency of the first and/or the second laser pulse. Such a frequency shift or tuning of the wavelength can be performed in the radiation source itself or in the amplifier assembly, for example, between two optical amplifiers. The drive laser assembly can have for this purpose at least one frequency shift unit (or frequency shifter) for shifting the laser frequency of one or possibly both laser pulses. The frequency shift unit can be, for example, an acousto-optical modulator. The tuning of the laser frequency can be performed, for example, as described in PCT/EP2014/064958, which is incorporated herein by reference in its entirety.

The amplification of the amplifier assembly can also be set by a frequency shift, e.g., by changing the wavelength of one or both laser pulses. For example, if the laser frequency of a laser pulse is shifted in relation to the maximum frequency, e.g., in relation to the frequency or wavelength at which the wavelength-dependent amplification of a respective optical amplifier is maximal, the amplification of the respective laser pulse decreases. Such a frequency shift, for example, as described in PCT/EP2014/064958, can be advantageously combined with the attenuation described here by the wavelength-selective optical element or elements, to optimize the amplifier assembly as a whole. In particular, the frequency shift can also be set or varied during the operation of the drive laser assembly, and therefore fine-tuning of the amplification generated by the amplifier assembly can be performed by the frequency shift.

In one embodiment, the attenuation of the first laser pulse at the first wavelength by the at least one wavelength-selective optical element during the propagation through the amplifier assembly is greater by more than 10% than the attenuation of the second laser pulse at the second wavelength during the propagation through the amplifier assembly. If two or more wavelength-selective optical elements are arranged in the amplifier assembly, the attenuation of more than 10% thus relates to the attenuation generated by the entirety of the wavelength-selective optical elements in the amplifier assembly (i.e., in total). Ideally, the second laser pulse at the second wavelength is not attenuated or is attenuated as little as possible by the at least one wavelength-selective optical element. However, achieving an attenuation of the second laser pulse by (almost) 0% by a wavelength-selective optical element may be possible with difficulty.

In one embodiment, the wavelength-selective optical element is a reflective optical element (or an optical reflector), the reflectivity of which at the first wavelength is less than the reflectivity thereof at the second wavelength. The use of a reflective optical element as a wavelength-selective element is advantageous, because the attenuation of the laser power is linear in principle in such an element, e.g., the reflected radiation component is independent of the incident laser power, e.g., independently of the strength of the incident laser power, a specific component of the incident laser radiation is reflected (reflection of x %).

The reflective optical element can be, for example, a (possibly partially-transmissive) mirror, which has less reflectivity at the first wavelength than at the second wavelength. The mirror can be provided in the drive laser assembly, for example, to cause folding of the beam path, or can be arranged in an optical amplifier or in a resonator of an optical amplifier. If a mirror is formed as a wavelength-selective optical element, for example, by applying a wavelength-selective reflective coating, it is not necessary to provide an additional wavelength-selective optical element in the drive laser assembly.

The reflectivity of such a mirror or such a reflective optical element for the second wavelength is to be as large as possible, while the reflectivity for the first wavelength is reduced in relation to the maximum possible reflectivity by a desired amount, and therefore the absorption is increased by a desired amount. To generate a desired attenuation of the first laser pulse, a plurality (or in principle an arbitrary number) of mirrors having a predefined absorption or reflection suppression for the first wavelength can be provided in the beam path of the amplifier assembly. The use of multiple mirrors for attenuating the first laser pulse can be advantageous in particular to avoid the absorption for the first wavelength being sufficiently large at the individual mirrors that it is possibly degraded.

In one implementation, the wavelength-selective reflective optical element is a deflection mirror of the amplifier assembly. It is advantageous to use a deflection mirror as a wavelength-selective optical element, because deflection mirrors are typically required in any case in the beam path of the amplifier assembly. However, it is apparent that the wavelength-selective optical element can also be another type of reflective optical element in place of a deflection mirror or a folding mirror.

In another implementation, the wavelength-selective reflective optical element has a reflectivity of less than 90% at the first wavelength. The power of the first laser pulse is reduced in this manner by a fraction of 100%-10%, and therefore only a corresponding fraction of 90% or less is amplified in possible downstream amplifiers of the amplifier assembly and therefore only a corresponding fraction of the reflected laser radiation is amplified in the upstream amplifier(s) in the beam path of the amplifier assembly.

In a further embodiment, the wavelength-selective optical element is a transmissive optical element (or transmissive optical device), the transmission of which at the second wavelength is greater than at the first wavelength. Alternatively or additionally to a wavelength-selective reflective optical element, a wavelength-selective transmissive optical element can optionally also be introduced into the beam path of the amplifier assembly, to reduce the amplification of the first laser pulse and in this manner increase the protection from reflections. The wavelength-selective transmissive optical element has for this purpose a greater absorption (in %) for the first wavelength than for the second wavelength. The transmissive wavelength-selective optical element can be, for example, an additional optical element in the form of a plane-parallel plate, which is introduced into the beam path of the amplifier assembly and to which a wavelength-selective coating is applied. The wavelength-selective optical element can also be a transmissive optical element provided in the amplifier assembly, for example, an entry window or an exit window of an optical amplifier, for example, in the form of a plane-parallel plate. Such windows can be used to hold a gaseous amplifier medium in the respective optical amplifier.

In one embodiment, the wavelength-selective optical element has a wavelength-selective coating. The use of a wavelength-selective coating is advantageous both in the case of a reflective optical element and also in the case of a transmissive wavelength-selective optical element, because a sufficient difference in the degree of absorption between the first and the second wavelengths can be generated using such a coating. This also applies in particular to the case in which the first wavelength and the second wavelength differ only slightly from one another.

In a further embodiment, the radiation source is designed to generate the first laser pulse at a first wavelength, which deviates by 0.5 µm or less from the second wavelength of the second laser pulse. Two laser sources can be provided in the radiation source, which generate laser radiation at the two different laser wavelengths. Both the first laser pulse and the second laser pulse can be generated, for example, by $CO_2$ laser sources. In this case, different lines in the absorption spectrum of a $CO_2$ laser gas can possibly be used or excited to generate the two laser pulses, for example, one line at a wavelength of 10.6 µm and one line at a wavelength in the range between 10.1 µm and 10.35 µm. In this case, for example, a first $CO_2$ laser source can generate the first laser pulse having a wavelength in the range specified above between 10.1 µm and 10.35 µm and a second $CO_2$ laser source can generate the second laser pulse having a wavelength of 10.6 µm. The radiation source can optionally have a single $CO_2$ laser source and tune the wavelength of the exiting laser radiation or switch between the first wavelength and the second wavelength.

In a further embodiment, the drive laser assembly is designed to amplify the first laser pulse having the first wavelength during the propagation through the amplifier assembly in a first propagation direction, which originates from the radiation source, with a greater power-dependent amplification than in a second propagation direction opposite to the first. Since only the reflection of the first laser pulse is to be suppressed, it is advantageous in principle if the first laser pulse experiences a greater amplification in the forward direction, i.e., in the first propagation direction, than in the second propagation direction (reverse direction). Such a different amplification in the forward and reverse directions in the amplifier assembly can be implemented because the suppression or the attenuation of the power by the wavelength-selective optical element is linear in principle (reflection or transmission of x % independent of the laser power), while the amplification in the optical amplifier or amplifiers possibly takes place nonlinearly, i.e., is dependent on the strength of the laser power. The latter is the case in particular if an optical amplifier is operated in the saturation state, in which the power of the amplified laser radiation is bounded to further increase, e.g., the amplification decreases with increasing coupled-in laser power. Therefore, by suitable positioning of the wavelength-selective optical element or elements in the beam path before or after the optical amplifier or amplifiers having a nonlinear amplification, an optimization of the amplification of the first laser pulse in the forward direction can take place in relation to the suppression of the first laser pulse in the reverse direction.

It is to be noted in this case that particularly high powers occur in the amplifier assembly both at the end facing away from the radiation source (because of the first laser pulse propagating in the forward direction) and also at the end facing toward the radiation source (because of the reflected first laser pulse running in the reverse direction), and therefore the absorption or the suppression, respectively, of a wavelength-selective optical element arranged there is not to be selected as excessively large, to avoid a degradation of the wavelength-selective optical element by the laser radiation. Although the amplification in the optical amplifier or amplifiers for the first laser pulse having lesser laser power takes place essentially in the linear amplification range, an optimization potential exists with respect to the different amplification.

The term "amplification" of an optical amplifier is understood in the meaning of this application as the so-called small signal amplification, more precisely the amplification coefficient of the small signal amplification. In the case of small signal amplification, saturation effects are not considered. Optical amplifiers have a frequency-dependent small signal amplification or a frequency-dependent amplification profile, which can essentially correspond to a Lorentz profile in the case of a $CO_2$ gas laser or amplifier, for example. The amplification profile has a maximum $V_{MAX}$ of the (small signal) amplification at a maximum frequency $f_M$. For the (non-scaled) maximum amplification $V_{MAX}$, i.e., for the amplification coefficient of the small signal amplification, the following equation applies according to laser theory:

$$V_{MAX}=c^2/(8\pi f_M^2 \Delta B)(N_2-N_1)1/\tau_{sp},$$

where $\Delta B$ denotes the half width or the amplifier bandwidth of the frequency-dependent amplifier profile, $N_2$ and $N_1$ denote the population density of the upper and lower energy levels, respectively, and $\tau_{sp}$ denotes the mean lifetime in the upper energy level. The (small signal) amplification $V_{MAX}$ has the unit 1/length, for example, $cm^{-1}$. The amplifier assembly can have multiple amplifiers connected in series, which provide a specific inversion for the first laser pulse (pre-pulse) and for the second laser pulse (main pulse), and therefore a determined (maximal) amplification is available for each of the two laser pulses for the first and the second wavelength, respectively.

In a further embodiment, the wavelength-selective optical element is arranged before or in at least one optical amplifier in the first propagation direction, which amplifies the first laser pulse using less than a maximal power-dependent amplification, i.e., the amplification is less than the maximum (linear) amplification $V_{MAX}$. This is the case if saturation effects occur in the optical amplifier. In this case, it is advantageous if the wavelength-selective optical element is arranged in the beam path before, or optionally in, the optical amplifier, because in this case a lesser attenuation of the laser power takes place in the forward direction than in the reverse direction, because the power of the reflected first laser pulse is sufficiently low that it is not operated in saturation in the reverse direction.

A further aspect of the disclosure relates to EUV radiation generating devices that include a drive laser assembly, including a radiation source, which is designed to generate a first laser pulse having a first wavelength and a second laser pulse having a second wavelength, and an amplifier assembly having at least one optical amplifier for amplifying the first laser pulse and the second laser pulse, a vacuum chamber, in which a target material can be arranged at a target position, and a beam guiding unit (or a beam guide such as an optical fiber or an optical waveguide) for guiding the first laser pulse and the second laser pulse from the drive laser unit in the direction toward the target position, and at least one wavelength-selective optical element, which is designed to attenuate the first laser pulse at the first wavelength more strongly than the second laser pulse at the second wavelength.

As described herein, a pre-pulse (first laser pulse) having lesser laser power and, chronologically shortly thereafter, a main pulse (second laser pulse) having greater laser power are guided to a target material, for example, in the form of tin droplets, to convert it into a plasma state. In particular in the case of the first laser pulse, the problem exists that a radiation component reflected on the target material is amplified in the amplifier assembly of the drive laser unit and can damage optical elements arranged in the beam path. This risk can be reduced by the at least one wavelength-selective optical element. The at least one wavelength-selective optical element can be arranged in the drive laser assembly, in particular in the amplifier assembly, but also at another point in the beam path, for example, in the beam guiding unit for guiding the first and the second laser pulse to the target position.

The disclosure also relates to methods including: amplifying the first laser pulse having the first wavelength and the second laser pulse having the second wavelength in at least one optical amplifier of an amplifier assembly of the drive laser assembly, where the first laser pulse is more strongly attenuated than the second laser pulse by at least one wavelength-selective optical element. As described above, the attenuation is caused by at least one wavelength-selective optical element having a respective different reflectivity or transmission at the two different wavelengths.

In one implementation, the first laser pulse at the first wavelength is attenuated at the at least one wavelength-selective optical element by more than 10% more strongly than the second laser pulse at the second wavelength. Such a difference in the attenuation can be generated, for example, by an at least 10% different reflectivity or by an at least 10% different transmission of the wavelength-selective optical element or elements at the two wavelengths.

In a further variant, the first laser pulse having the first wavelength is amplified during the propagation through the amplifier assembly in a first propagation direction, which originates from a radiation source of the amplifier assembly, using a greater power-dependent amplification than in a second propagation direction opposite to the first. As described herein, the reflection of the first laser pulse is to be effectively suppressed, in contrast, the resulting attenuation of the laser pulse propagating in the forward direction is not to be excessively large. This can be achieved by suitable positioning of the wavelength-selective optical element in the beam path of the amplifier assembly.

Further advantages of the invention result from the description and the drawing. The above-mentioned features and the features set forth hereafter can also be used per se or in multiples in arbitrary combinations. The embodiments that are shown and described herein are not to be understood as an exhaustive list, but rather have an exemplary character for the description of the invention.

DETAILED DESCRIPTION

In the following description of the drawings, identical reference signs are used for identical or functionally identical components.

Figure 1A:
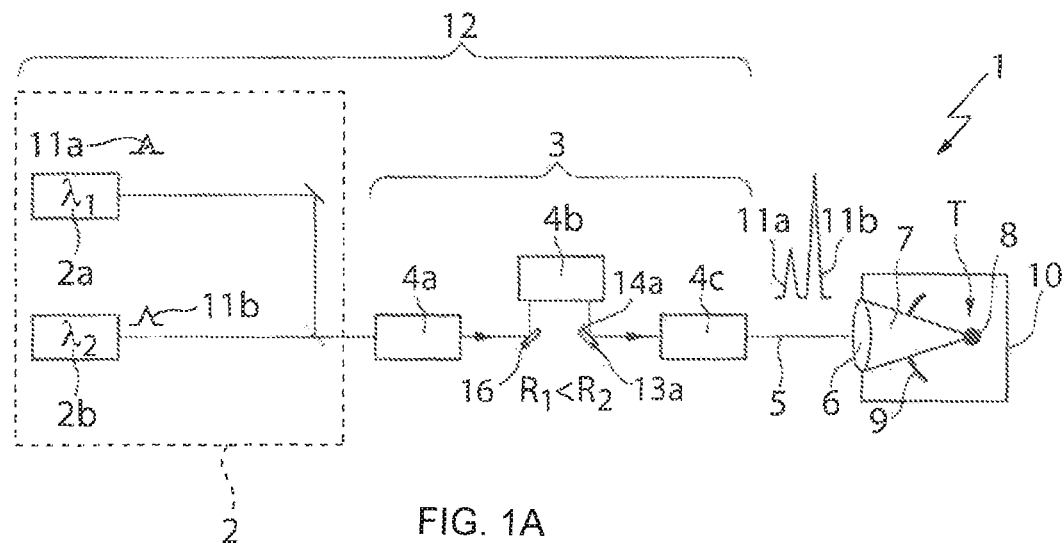
FIG. 1A shows a schematic illustration of an EUV radiation generating device having a drive laser assembly, which includes an amplifier assembly having two reflective wavelength-selective optical elements.

FIG. 1A very schematically shows an EUV radiation generating device (or EUV radiation generator) 1, which has a radiation source 2, an amplifier assembly 3 having three optical amplifiers 4a, 4b, 4c or amplifier stages, a beam guiding device 5 (not shown in greater detail), and a focusing lens 6. The focusing lens 6 is used for the purpose of focusing a first and second laser pulse 11a, 11b, which are generated by the radiation source 2 and amplified by the amplifier assembly 3, on a target region or a target position T, at which a target material 8 is introduced. The target material 8 passes into a plasma state upon the irradiation using the first and second laser pulse 11a, 11b and emits EUV radiation at the same time, which is focused by a collector mirror 9.

In the example shown in FIG. 1A, the collector mirror 9 has an opening for the passage of the first and second laser pulse 11a, 11b and the focusing lens 6 separates a vacuum chamber 10, in which the target material 8 is arranged, from the beam guiding device 5. The radiation source 2 has, in the example shown, a first and a second laser source 2a, 2b in the form of $CO_2$ lasers, which generate the first laser pulse 11a (pre-pulse) and the second laser pulse 11b (main pulse) in short chronological succession, to amplify them jointly, e.g., in a common beam path, in the amplifier assembly 3, and focus them onto the target material 8 or in the region of the target position T. The radiation source 2 forms, jointly with the amplifier assembly 3, a drive laser assembly 12 of the EUV radiation generating device 1.

The first laser source 2a is used in the example shown to generate the first laser pulse 11a at a first wavelength $\lambda_1$ of 10.6 μm and the second laser source 2b is used to generate the second laser pulse 11b at a second wavelength $\lambda_2$, which is different from the first and can be, for example, between 10.1 μm and 10.35 μm (or vice versa). The two wavelengths $\lambda_1$, $\lambda_2$ differ in the example shown by not more than 0.5 μm. The beam paths of the two laser sources 2a, 2b are guided together and/or superimposed before the amplifier assembly 3. For this purpose, a (passive) superposition unit, for example, a partially-transmissive mirror can be used, as shown in FIG. 1A.

As can be seen in FIG. 1A on the basis of the pulse levels, the two laser pulses 11a, 11b are generated by the laser source 2 having approximately equal power, but are amplified by different strengths in the amplifier assembly 3, and therefore the amplified first laser pulse 11a has a lesser laser power at the output of the amplifier assembly 3 than the amplified second laser pulse 11b. The amplification of the amplifier assembly 3 for the first laser pulse 11a can be, for example, less than 90%, possibly less than 70%, possibly even less than approximately 50% of the amplification of the amplifier assembly 3 for the second laser pulse 11b. This is advantageous because the first laser pulse 11a is to be incident on the target material 8 with a lesser power than the second laser pulse 11b.

Figure 1B:
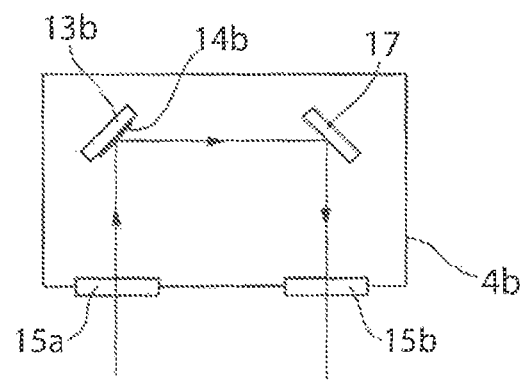
FIG. 1B is a schematic illustration of an optical amplifier of the amplifier assembly of FIG. 1A, in which a wavelength-selective optical element is arranged.

The different amplification of the two laser pulses 11a, 11b in the amplifier assembly 3 is achieved in that a first wavelength-selective optical element in the form of a first wavelength-selective mirror 13a and a second wavelength-selective optical element in the form of a second wavelength-selective mirror 13b are arranged in the amplifier assembly 3 (cf. FIG. 1B). The two wavelength-selective mirrors 13a, 13b each have a reflectivity $R_1$ at the first wavelength $\lambda_1$ of the first laser pulse 11a and a reflectivity $R_2$ at the second wavelength $\lambda_2$ of the second laser pulse 11b. The reflective R1 at the first wavelength is less than the reflectivity $R_2$ at the second wavelength $\lambda_2$, i.e., $R_1<R_2$. To generate the difference between the two reflectivities $R_1$, $R_2$, the two wavelength-selective mirrors 13a, 13b each have a wavelength-selective coating 14a, 14b. In the example shown, the difference between the reflectivity $R_1$ at the first wavelength $\lambda_1$ and the reflectivity $R_2$ at the second wavelength $\lambda_2$ at a respective wavelength-selective mirror 13a, 13b is greater than 10%. The first laser pulse 11a is accordingly attenuated by a total of 20% more strongly at the two wavelength-selective mirrors 13a, 13b than the second laser pulse 11b, whereby the total amplification of the amplifier assembly 3 for the first laser pulse 11a decreases accordingly.

In the example shown, the respective wavelength-selective mirror 13a, 13b has a reflectivity $R_1$ at the first wavelength $\lambda_1$ of less than 90%, while the reflectivity $R_2$ at the second wavelength $\lambda_2$ is approximately 98%, which corresponds to the maximum technically implementable or desired reflectivity $R_2$ at the second wavelength $\lambda_2$.

As can be seen in FIG. 1A, the first wavelength-selective mirror 13a is a deflection mirror, which is arranged in the beam path after the second optical amplifier 4b to deflect the laser pulses 11a, 11b to the third optical amplifier 4c. A conventional, non-wavelength-selective mirror 16 is used to deflect the laser pulses 11a, 11b originating from the first optical amplifier 4a to the second optical amplifier 4b.

FIG. 1B shows the second optical amplifier 4b, in which the second wavelength-selective mirror 13b is arranged, in a detailed representation. The second optical amplifier 4b has an entry window 15a and an exit window 15b, which are designed as plane-parallel plates and through which the laser pulses 11a, 11b enter the second optical amplifier 4b and exit from the second optical amplifier 4b, respectively. The second wavelength-selective mirror 13b forms a first deflection mirror of the second optical amplifier 4b and is used to deflect the two laser pulses 11a, 11b onto a non-wavelength-selective second deflection mirror 17, which is arranged in the second optical amplifier 4b. A gaseous amplifier medium, e.g., in the form of $CO_2$ gas, is introduced into the second optical amplifier 4b in the example shown. It is apparent that the further deflection mirror 17 can optionally also be designed as a wavelength-selective optical element, which has a lesser reflectivity $R_1$ for the first wavelength $\lambda_1$ than for the second wavelength $\lambda_2$, to amplify (or increase) the attenuation of the first laser pulse 11a. Due to the use of two or more wavelength-selective optical elements 13a, 13b, which are arranged at different locations in the amplifier assembly 3, the overall amplification can be optimized and/or the effects of the two wavelength-selective optical elements 13a, 13b can be balanced out, if individual ones of the optical amplifiers 4a-c are operated in saturation (see below). In this manner, a fine adjustment of the amplifier assembly 3 can be performed. The use of two or more wavelength-selective optical elements 13a, 13b in place of a single wavelength-selective optical element is also advantageous for the case in which, because of manufacturing, the difference between the reflectivities $R_1$, $R_2$ of a single wavelength-selective coating cannot be selected to be sufficiently large for the two different wavelengths $\lambda_1$, $\lambda_2$.

To retrieve the required power of the first laser pulse 11a upon incidence on the target material 8 in spite of the attenuation of the first laser pulse 11a by the wavelength-selective mirrors 13a, 13b, the power of the first laser source 2a is adapted suitably. The (lower) power with which the first laser pulse 11a of the first laser source 2a can be generated without the attenuation by the wavelength-selective optical elements 13a, 13b is indicated by dashed lines in FIG. 1A within the first laser pulse 11a.

Figure 2:
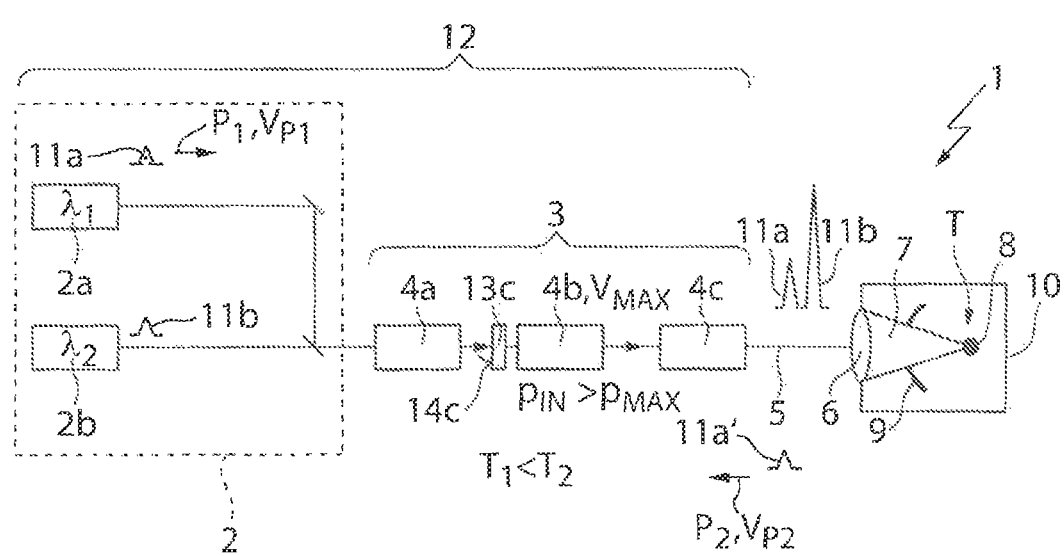
FIG. 2 is a schematic illustration of an EUV radiation generating device similar to FIG. 1A, which has an amplifier assembly having a transmissive wavelength-selective optical element.

FIG. 2 shows an example of an EUV radiation generating device 1, in which in place of a reflective wavelength-selective optical element (or a reflective wavelength selector), a transmissive wavelength-selective optical element (or a transmissive wavelength selector) 13c in the form of a planar plate which has a wavelength-selective coating 14c is arranged in the beam path between the first optical amplifier 4a and the second optical amplifier 4b. While the material of the planar plate, which is used as the carrier element for the wavelength-selective coating 14c, transmits both wavelengths $\lambda_1$, $\lambda_2$ at equal strength, a transmission $T_1$ is generated by the wavelength-selective coating 14c at the first wavelength $\lambda_1$, which is less than the transmission $T_2$ of the wavelength-selective coating 14c at the second wavelength $\lambda_2$.

In this manner, similar to the example described above in conjunction with FIGS. 1A and 1B, the amplification of the first laser pulse 11a is attenuated in relation to the amplification of the second laser pulse 11b in the amplifier assembly 3. Instead of the transmissive optical element 13c, which is arranged in the beam path between the first optical amplifier 4a and the second optical amplifier 4b, an entry window and/or an exit window of a respective optical amplifier 4a-c can possibly also be used as a transmissive wavelength-selective optical element, for example, the entry window 15a shown in FIG. 1B or the exit window 15b of the second optical amplifier 4b shown in FIG. 1B.

As described above, the amplification of a laser pulse 11a' reflected at the target material 8 is to be reduced by the attenuation of the first laser pulse 11a. If one presumes that the amplification of the first laser pulse 11a takes place linearly in the amplifier assembly 3, i.e., is independent of the absolute value of the laser power, the amplification for the laser pulse 11a, which propagates from the radiation source 2 in a first propagation direction P1 (forward direction) and the amplification for the first laser pulse 11a', which propagates in a second propagation direction P2 opposite to the first, are equal in size.

It is advantageous if the amplifier assembly 3 amplifies the first laser pulse 11a during the propagation through the amplifier assembly 3 in the first propagation direction P1 with a greater power-dependent amplification $V_{P1}$ than the returning laser pulse 11a' in the second propagation direction P2, which is opposite to the first, i.e., if the amplification $V_{P1}$, $V_{P2}$ of the amplifier assembly 3 is dependent on the propagation direction P1, P2. Such an amplification dependent on the propagation direction P1, P2 can be implemented if at least one, for example, the second optical amplifier 4b, operates in saturation operation, e.g., the laser power $p_{IN}$ coupled into the second optical amplifier 4b is greater than a power threshold value $p_{MAX}$, at which or below which the second amplifier 4b amplifies the coupled laser power with its maximal (linear) amplification $V_{MAX}$.

If, as in the example shown in FIG. 2, the wavelength-selective optical element 13a is arranged before the second optical amplifier 4b in the first propagation direction P1 and the power $p_{IN}$ coupled into the second optical amplifier 4b is above the threshold value $p_{MAX}$, the attenuation of the power in the first propagation direction P1 has a less strong effect than in the second propagation direction P2, if the first optical amplifier 4a is not also operated in saturation operation. In general, the absolute value of the power of the reflected first laser pulse 11a' is sufficiently small that all three optical amplifiers 4a-c for the second propagation direction P2 do not operate in saturation operation, e.g., the power coupled in the second propagation direction P2 is below the threshold value $p_{MAX}$ in each case. The amplification $V_{P1}$ of the amplifier assembly 3 for the first laser pulse 11a in the first propagation direction P1 is therefore greater than the amplification $V_{P2}$ for the reflected first laser pulse 11a' in the second propagation direction P2.

It is apparent that the wavelength-selective (transmissive or reflective) optical element 13, 13a can also be arranged at another point in the beam path of the amplifier assembly 3, for example, before the first optical amplifier 4a or (directly) after the third optical amplifier 4c, or at another point between the optical amplifiers 4a to 4c. A transmissive wavelength-selective optical element 13a can also be arranged in an optical amplifier 4a, 4b, or 4c. Although laser sources 2a, 2b in the form of $CO_2$ lasers were described above, of course, laser sources can also be used which generate other first and second wavelengths $\lambda_1$, $\lambda_2$, respectively, where these can deviate from one another by more than 0.5 µm in particular.

In addition to the above-described wavelength-selective optical elements 13a, 13b, 13c, the drive laser assembly 12 can also have a frequency shift unit (or frequency shifter), to set or change the laser frequency or the laser wavelength $\lambda_1$, $\lambda_2$. The frequency shift unit can be designed, for example, as an acousto-optical modulator. Since the amplification of the individual amplifiers 4a, 4b, 4c and therefore the total amplification of the amplifier assembly 3 is wavelength-dependent, the change of the laser wavelength $\lambda_1$, $\lambda_2$ results in a change of the amplification of the respective laser pulses 11a, 11b in the individual optical amplifiers 4a, 4b, 4c. The setting of the amplification with the aid of a frequency shift unit is also possible during the operation of the EUV radiation generating device 1, and therefore fine-tuning of the total amplification of the amplifier assembly 3 can be performed in operation.

In summary, in the above-described manner, a reduction of the amplification of the first laser pulse 11a by the amplifier assembly 3 in relation to the amplification of the laser power of the second laser pulse 11b by the amplifier assembly 3 can advantageously be performed. In this case, in particular the amplification of a first laser pulse 11a' reflected on the target material 8 during the propagation back through the amplifier assembly 3 can be effectively attenuated. It is apparent that a wavelength-selective optical element which suppresses the first laser pulse 11a more strongly than the second laser pulse 11b can also be arranged at another point in the common beam path of the two laser pulses 11a, 11b in the EUV radiation generating device 1, for example, in the beam guiding unit 5.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:
1. A drive laser system comprising:
a radiation source configured to generate a first laser pulse having a first wavelength and a second laser pulse having a second wavelength that is different from the first wavelength;
at least one wavelength selector configured to attenuate the first laser pulse at the first wavelength more strongly than the second laser pulse at the second wavelength; and
an amplifier system comprising at least one optical amplifier configured to amplify the first laser pulse with a first amplification and the second laser pulse with a second amplification together in a same beam path in chronological succession,
wherein the first amplification of the first laser pulse in the amplifier system is reduced in relation to the second amplification of the second laser pulse in the amplifier system by the at least one wavelength selector more strongly attenuating the first laser pulse than the second laser pulse.
2. The drive laser system of claim 1, wherein the attenuation of the first laser pulse at the first wavelength by the at least one wavelength selector during propagation through the amplifier system is greater by more than 10% than the attenuation of the second laser pulse at the second wavelength during propagation through the amplifier system.

3. The drive laser system of claim 1, wherein the wavelength selector comprises an optical reflector having a first reflectivity at the first wavelength and a second reflectivity at the second wavelength, wherein the first reflectivity is smaller than the second reflectivity.

4. The drive laser system of claim 3, wherein the wavelength selector comprises a deflection mirror of the amplifier system.

5. The drive laser system of claim 3, wherein the first reflectivity is less than 90% at the first wavelength.

6. The drive laser system of claim 1, wherein the wavelength selector comprises a transmissive optical device having a first transmission at the first wavelength and a second transmission at the second wavelength, wherein the first transmission is smaller than the second transmission.

7. The drive laser system of claim 1, wherein the wavelength selector has a wavelength-selective coating.

8. The drive laser system of claim 1, wherein the radiation source is configured to generate the first laser pulse at the first wavelength that deviates by 0.5 µm or less from the second wavelength of the second laser pulse.

9. The drive laser system of claim 1, wherein the amplifier system is configured to amplify the first laser pulse having the first wavelength during propagation through the amplifier system in a first propagation direction originating from the radiation source, using a greater power-dependent amplification than in a second propagation direction opposite to the first.

10. The drive laser system of claim 9, wherein the wavelength selector is arranged in the first propagation direction before or in the at least one optical amplifier configured to amplify the first laser pulse with less than a maximal power-dependent amplification.

11. The drive laser system of claim 9, wherein the at least one optical amplifier is configured and controlled to:
  operate in a saturation state when the first laser pulse propagates in the first propagation direction through the at least one optical amplifier with a laser power greater than a power threshold value, and
  operate in an unsaturation state when a reflected first laser pulse propagates in the second propagation direction through the at least one optical amplifier with a reflected laser power below the power threshold value.

12. The drive laser system of claim 1, comprising two or more wavelength selectors configured and controlled to attenuate the first laser pulse more strongly than the second laser pulse.

13. The drive laser system of claim 1, wherein the radiation source is configured to generate the first laser pulse and the second laser pulse with approximately equal power, and
  wherein the first laser pulse with the first amplification has less power than the second laser pulse with the second amplification.

14. An EUV (extreme ultraviolet) radiation generator comprising:
  a drive laser system comprising:
    a radiation source configured to generate a first laser pulse having a first wavelength and a second laser pulse having a second wavelength that is different from the first wavelength,
    at least one wavelength selector configured to attenuate the first laser pulse at the first wavelength more strongly than the second laser pulse at the second wavelength, and
    an amplifier system having at least one optical amplifier configured to amplify the first laser pulse with a first amplification and the second laser pulse with a second amplification together in a same beam path in chronological succession, wherein the first amplification of the first laser pulse in the amplifier system is reduced in relation to the second amplification of the second laser pulse in the amplifier system by the at least one wavelength selector more strongly attenuating the first laser pulse than the second laser pulse,
  a vacuum chamber in which a target material can be arranged at a target position; and
  a beam guide configured to guide the first laser pulse and the second laser pulse from the drive laser system in a direction towards the target position.

15. The EUV radiation generator of claim 14, wherein the drive laser system is configured such that the first laser pulse and the second laser pulse are radiated in chronological succession in sequence onto the target material and pass through the amplifier system along a same beam path with a time delay.

16. A method of amplifying a first laser pulse having a first wavelength and a second laser pulse having a second wavelength in a drive laser system for an EUV (extreme ultraviolet) radiation generator, the method comprising:
  attenuating the first laser pulse more strongly than the second laser pulse using at least one wavelength selector, wherein the second wavelength is different from the first wavelength; and
  amplifying the first laser pulse with a first amplification and the second laser pulse with a second amplification together in a same beam path in chronological succession by the at least one optical amplifier of an amplifier system of the drive laser system,
  wherein the first amplification of the first laser pulse in the amplifier system is reduced in relation to the second amplification of the second laser pulse in the amplifier system by the at least one wavelength selector more strongly attenuating the first laser pulse than the second laser pulse.

17. The method of claim 16, wherein the first laser pulse at the first wavelength is attenuated by more than 10% more strongly than the second laser pulse at the second wavelength.

18. The method of claim 16, wherein the first laser pulse having the first wavelength is amplified during propagation through the amplifier system in a first propagation direction originating from a radiation source of the drive laser system, with a greater power-dependent amplification than in a second propagation direction opposite to the first propagation direction.

19. The method of claim 18, wherein the at least one wavelength selector is arranged in the first propagation direction before or in the at least one optical amplifier.

20. The method of claim 18, wherein the at least one wavelength selector is arranged in the first propagation direction after the at least one optical amplifier of the amplifier system.

21. The method of claim 18, wherein the at least one optical amplifier is configured to amplify the first laser pulse with less than a maximal power-dependent amplification.

* * * * *